United States Patent
Nakamura et al.

(10) Patent No.: US 7,498,830 B2
(45) Date of Patent: Mar. 3, 2009

(54) BURN-IN APPARATUS

(75) Inventors: Kazuhiro Nakamura, Osaka (JP); Tetsuya Shimada, Osaka (JP); Katsuhiko Watabe, Osaka (JP)

(73) Assignee: ESPEC Corp., Osaka (JP)

(*) Notice: Subject to any disclaimer, the term of this patent is extended or adjusted under 35 U.S.C. 154(b) by 477 days.

(21) Appl. No.: 11/195,004

(22) Filed: Aug. 1, 2005

(65) Prior Publication Data
US 2006/0032627 A1 Feb. 16, 2006

(30) Foreign Application Priority Data
Jul. 30, 2004 (JP) ............................. 2004-224848

(51) Int. Cl.
*G01R 31/28* (2006.01)
*H05K 7/20* (2006.01)

(52) U.S. Cl. ........................................ 324/760; 361/699

(58) Field of Classification Search ................ 324/760; 361/699, 701, 702; 165/80.4, 104.33; 257/714; 174/15.1
See application file for complete search history.

(56) References Cited

U.S. PATENT DOCUMENTS

| | | | |
|---|---|---|---|
| 4,745,354 A | 5/1988 | Fraser | |
| 4,897,762 A | 1/1990 | Daikoku et al. | |
| 5,131,233 A | 7/1992 | Cray et al. | |
| 5,290,710 A | 3/1994 | Haj-Ali-Ahmadi et al. | |
| 5,515,910 A * | 5/1996 | Hamilton et al. | 165/263 |
| 5,579,826 A | 12/1996 | Hamilton et al. | |
| 5,582,235 A | 12/1996 | Hamilton et al. | |
| 5,909,123 A | 6/1999 | Budnaitis | |
| 5,924,482 A | 7/1999 | Edwards et al. | |
| 5,999,404 A | 12/1999 | Hileman | |
| 6,349,554 B2 | 2/2002 | Patel et al. | |
| 6,394,575 B1 | 5/2002 | Kent | |
| 6,445,200 B2 | 9/2002 | Haseyama | |
| 6,498,725 B2 * | 12/2002 | Cole et al. | 361/700 |
| 6,557,622 B2 | 5/2003 | Frank et al. | |
| 6,889,509 B1 | 5/2005 | Cader et al. | |
| 6,975,028 B1 | 12/2005 | Wayburn et al. | |
| 6,996,996 B1 | 2/2006 | Cader | |
| 2002/0070745 A1 | 6/2002 | Johnson et al. | |
| 2002/0113142 A1 | 8/2002 | Patel et al. | |
| 2003/0090282 A1 | 5/2003 | Akram et al. | |
| 2004/0019452 A1 | 1/2004 | Song et al. | |
| 2004/0032274 A1 * | 2/2004 | Cader et al. | 324/760 |
| 2004/0050545 A1 | 3/2004 | Tilton | |
| 2004/0051545 A1 * | 3/2004 | Tilton et al. | 324/760 |

(Continued)

FOREIGN PATENT DOCUMENTS

JP 61-114377 6/1986

(Continued)

*Primary Examiner*—Ernest F Karlsen
(74) *Attorney, Agent, or Firm*—Jordan and Hamburg LLP

(57) ABSTRACT

The burn-in apparatus includes a water supply system and a sprayer and has a structure such that water is converted into mist and sprayed onto the upper surface of a device attached to a socket of a burn-in board. The amount of heat generated by the device that generates high heat is removed by the amount of heat that includes a large latent heat from when the mist falls on the upper surface and is evaporated. Burn-in of the device is conducted while it is being cooled to the target temperature.

3 Claims, 8 Drawing Sheets

U.S. PATENT DOCUMENTS

| | | |
|---|---|---|
| 2004/0182564 A1 | 9/2004 | Tremmel |
| 2004/0194492 A1 | 10/2004 | Tilton et al. |
| 2005/0041393 A1 | 2/2005 | Tustaniwskyi et al. |
| 2005/0063157 A1 | 3/2005 | Tustaniwskyi et al. |

FOREIGN PATENT DOCUMENTS

| | | |
|---|---|---|
| JP | 4-61259 | 2/1992 |
| JP | 4-321113 | 11/1992 |
| JP | 8-211122 | 8/1996 |
| JP | 11-231943 | 8/1999 |
| JP | 2000-97990 | 4/2000 |

\* cited by examiner (a)

(b)

(c)

(d)

(e)

(f)

(a)

(b)

BURN-IN APPARATUS

BACKGROUND OF THE INVENTION

The present invention relates to a burn-in apparatus capable of conducting cooling so as to obtain the target temperature of a semiconductor device that comprises a plane-like surface, generates heat when electric current is passed therethrough, has the temperature thereof rising to above the target temperature, and has the temperature of the surface rising.

A burn-in apparatus for semiconductor devices (referred to hereinbelow as "devices") is generally known in which a multiplicity of devices are mounted on burn-in boards, the boards are stacked in multiple stages in a temperature controlled chamber, electric current is passed through the devices, hot air with a temperature adjusted to the prescribed temperature, for example 125° C., is caused to flow parallel to the burn-in boards inside the chamber and circulate, while uniformly cooling the multiplicity of devices (see, for example, Patent References 1, 2, 3). With such a burn-in apparatus, in the case of conventional devices, the internal temperature of the devices generating heat when a current is passed therethrough is adjusted to a temperature appropriate for the burn-in test, which is about 150° C., in correspondence with the temperature of the circulating hot air and a burn-in test of the multiplicity of devices can be conducted with good efficiency.

Furthermore, Patent Reference 3 describes, as the conventional technology, that detecting the temperature inside the chamber and maintaining it at a constant level is insufficient for directly controlling the temperature of the device itself and, therefore, a diode is formed in a hollow space of a semiconductor chip and the junction temperature of the semiconductor chip is evaluated based on the electric characteristics of the diode (see the same Patent Reference 3).

Furthermore, the Patent Reference 3 also suggests a burn-in test apparatus in which a wiring section for temperature measurements is disposed over the entire integrated circuit section of each semiconductor chip, the average temperature of the chip is detected via a connection pad provided similarly to the connection pad for current supply to the integrated circuit section, the air with adjusted temperature is supplied from air-blow fans disposed in correspondence with each semiconductor chip in a temperature adjusting apparatus, and the air flow amount supplied to each chip is controlled so that the average temperature of the chip becomes the target burn-in temperature.

On the other hand, in recent years, devices generating a large amount of heat, for example, up to about 300 W when an electric current is passed therethrough, have appeared on the market and the burn-in apparatuses have to be adapted to conduct the burn-in test thereof. However, the above-described conventional apparatuses of a general hot air circulation system cannot be adapted for the above-mentioned devices generating a large amount of heat because the air is used therein as a heat transfer medium that has to remove a large amount of heat generated by the device when an electric current is passed therethrough and the air has a low specific gravity and specific heat and can remove but a small amount of heat. For this reason, the temperature of the circulating air is reduced, the blowing speed is raised, and the amount of air is increased to increase the amount of removed heat, but in this case the size of the apparatus itself is increased, a large difference in cooling effect is observed between the upstream and downstream zones of the circulating air, and the accuracy of burn-in temperature decreases. Moreover, even if all the aforementioned measures are taken, the amount of removed heat is still limited to about 30 W. For these reasons, such devices generating a large amount of heat cannot be burn-in tested with the apparatuses of the hot air circulation system.

Furthermore, in the apparatuses where the temperature of each chip is detected and the amount of cooling air supplied to each chip is controlled, the amount of blown air can be somewhat increased and the amount of removed heat can be increased, but because the cooling medium is air, no sufficient increase in the amount of removed heat can be attained and such apparatuses similarly cannot be adapted to burn-in test the devices that generate a large amount of heat.

A temperature control apparatus of an air injection system is known as another example of the apparatuses used, e.g., for burn-in testing the devices. In such an apparatus, air injection nozzles are disposed above and below each object and low-temperature air is ejected therefrom (see Patent Reference 4). In this apparatus, no problems are associated with temperature distribution among the devices even when the flow speed of the air is increased to increase the flow rate thereof, but because the heat transfer medium is air, the amount of the removed heat cannot be greatly increased for the same reasons as described above, and the apparatus cannot be adapted to devices generating a large amount of heat.

A temperature test apparatus is known as a burn-in apparatus using no hot air, wherein a multiplicity of electronic components, which are devices, are carried on a printed board serving as a burn-in board, a cooling plate having circulating therein a cooling liquid that is cooled in a water-cooled heat exchanger is brought into contact with the printed board, and the electronic components are temperature tested, while being cooled if necessary (see Patent Reference 5).

With this apparatus, the amount of heat removed by cooling can be increased because heat is taken from the electronic components to boil and evaporate the liquid coolant. However, in such an apparatus, the entire bottom surface of the plate is covered with the liquid coolant and heat enters only from the portion of this surface that is in contact with the electronic device. For this reason, heat transfer at the liquid coolant side is of a perfect film boiling and evaporation mode and, therefore, a substantially increased value of heat transfer coefficient of this surface portion cannot be obtained. Another problem associated with this apparatus is that because there is a difference between the pressure inside the plate and the external pressure, which is usually the atmospheric pressure, and because the plate surface area increases since all the electronic components have to be cooled with one plate, the plate thickness cannot be decreased and heat penetration ability cannot be improved. Yet another problem is that because the plate has a flat surface with high flexural rigidity, a sufficient contact with all the electronic components cannot be obtained due to the unavoidable small differences in level. Because of the aforementioned problems, cooling performance that enables a burn-in test of devices generating a large amount of heat cannot be obtained.

A cooling structure of mounted semiconductor chips is known in which each individual semiconductor chip is covered with a thick cap and solder joined, bellows having a property of mitigating thermal expansibility are disposed therebetween, a nozzle is disposed above each individual cap, a liquid coolant is supplied thereto from a coolant supply tube, the coolant liquid is atomized by the nozzle and blown onto the cap, the heat generated by the semiconductor chip is passed through the cap that covers it and is absorbed by the coolant, the coolant is evaporated by the heat and released from a release vent, the gas obtained is cooled in a refrigerator to convert it into liquid, and this liquid is again supplied to the coolant supply tube, this cooling structure making it possible to remove the heat from the mounted semiconductor chips with good efficiency (see Patent Reference 6).

With this type of cooling structure, there is no need to attach or detach a device for the purpose of cooling as is the case with a burn-in apparatus, and so the semiconductor chip and the cap are joined; therefore, this structure cannot be used as a burn-in apparatus.

[Patent Reference 1] Japanese Patent Application Laid-open No. H8-211122 (FIG. 1 and relevant explanation in the specification).

[Patent Reference 2] Japanese Patent Application Laid-open No. H 11-231943 (FIG. 1 and Par. No. 25 in the specification).

[Patent Reference 3] Japanese Patent Application Laid-open No. 2000-97990 (FIG. 4 and Par. Nos. 3, 4; FIGS. 1 and 2 and relevant explanation in the specification).

[Patent Reference 4] Japanese Patent Application Laid-open No. H4-321113 (FIG. 1 and relevant explanation in the specification).

[Patent Reference 5] Japanese Utility Model Application Laid-open No. S61-114377 (FIG. 1 and relevant explanation in the specification).

[Patent Reference 6] Japanese Patent Application Laid-open No. H4-61259 (FIG. 1 and relevant explanation in the specification).

BRIEF SUMMARY OF THE INVENTION

It is an object of the present invention to resolve the above-described problems inherent to the conventional technology and to provide a burn-in apparatus that has a simple structure and low costs of operation and that is suitable for burn-in of semiconductor devices that generate high heat.

In order to resolve the above-described problems, a first aspect of the invention provides a burn-in apparatus capable of conducting cooling so as to obtain a burn-in temperature of a semiconductor device that comprises a plane-like one surface, generates heat when electric current is passed therethrough, has the temperature thereof rising to above the burn-in temperature, and has the temperature of the one surface rising, this apparatus comprising liquid supply means capable of supplying by pressurizing liquid that serves as heat transfer medium for the cooling and that has a saturation temperature lower than the temperature of the one surface at the time of the aforementioned temperature rise, and liquid discharge means provided so that the liquid is supplied, discharged at a reduced pressure, and atomized to reach the one surface.

A second aspect of the invention provides a burn-in apparatus capable of conducting cooling so as to obtain a burn-in temperature of a semiconductor device that comprises a plane-like one surface, generates heat when electric current is passed therethrough, has the temperature thereof rising to above the burn-in temperature, and has the temperature of the one surface rising, this apparatus comprising: liquid supply means capable of supplying by pressurizing liquid that serves as a heat transfer medium for the cooling and that has a saturation temperature lower than the temperature of the one surface at the time of the aforementioned temperature rise, a separation member that can be pressed against the one surface and separated from the one surface and is provided so that it covers the one surface when pressed thereagainst and facilitates passage of heat from the one surface, and a liquid discharge means provided so that the liquid is supplied, discharged at a reduced pressure, and atomized to reach a surface opposite to the one surface on the separation member.

In a third aspect of the invention, in addition to the features of the first aspect of the invention, the one surface faces downward.

In a fourth aspect of the invention, in addition to the features of the first and second aspects of the invention, there are provided a temperature detection means for detecting the temperature of the semiconductor device, a flow rate adjustment means capable of adjusting the flow rate of the liquid, and a control means for controlling the flow rate adjustment means so that the temperature detected by the temperature detection means becomes the burn-in temperature.

In a fifth aspect of the invention, in addition to the features of the invention of any of the previous aspects of the invention, the liquid is water, the liquid supply means is a water supply means, and the liquid discharge means is a water discharge means.

As described hereinabove, the first aspect of the invention provides a burn-in apparatus capable of conducting cooling so as to obtain a burn-in temperature of a semiconductor device that comprises a plane-like one surface, that generates heat when electric current is passed therethrough and has the temperature rising higher than the usual 150° C. for the burn-in temperature, and that has the temperature of the one surface rising in correspondence with the burn-in temperature to a temperature about 10° C. lower than it, this apparatus comprising liquid supply means capable of supplying by pressurizing a liquid heat transfer medium that has a saturation temperature lower than the temperature of the one surface, and liquid discharge means provided so that the liquid is supplied, decompressed, discharged, and atomized to reach the one surface. Therefore, even when the amount of heat generated by operating semiconductor device is large, this amount of heat can be removed.

Thus, the following relationship exists between the first aspect of the invention and the operation effect thereof. Because liquid of a saturation temperature lower than the abovementioned 140° C. that is the temperature of the one surface during burn-in is supplied, the liquid can absorb the latent heat of evaporation from the one surface; because the amount of heat removed by the latent heat of evaporation of this liquid is considerably larger than the amount of heat removed by air, which is the cooling medium of the conventional apparatus, the cooling effect is great; when a pressure of the pressurized liquid is reduced down to the atmospheric pressure of the atmospheric pressure environment that is the environment of the burn-in test room in a plant where a burn-in apparatus is normally set up, the liquid can be atomized by a sprayer that can comprise a liquid discharge means; and because in this way a liquid discharge means such as a sprayer has been provided so that the liquid is atomized and strikes the one surface, when it hits the one surface, the mist that is the atomized liquid assumes a state of nucleate boiling in which the heat transfer coefficient reaches maximum thereon, and therefore it can be reliably evaporated while thereon. Eventually, a large amount of heat generated by the semiconductor device can be reliably removed via the one surface due to a large amount of absorbed heat comprising the sensible heat and latent heat realized during heat absorption by the liquid, enabling burn-in even for semiconductor devices that generate high heat.

With the second aspect of the invention, in addition to obtaining the same operation effect with the components identical to those of the first aspect of the invention, a separation member is provided that can be pressed against the one surface and separated from the one surface, this member being provided so that it covers the one surface when pressed thereagainst and facilitates passage of heat from the one surface. Therefore, because the liquid does not fall directly on the one surface of the device, this surface is unaffected by the collisions with the liquid and can be reliably prevented from being contaminated or discolored.

In this case, as described hereinabove, a structure is employed in which the fine particles of liquid do not fall directly on the one surface, but the heat of the one surface easily passes to the surface on the opposite side of the separation member that is pressed against the one surface. Therefore, the temperature of the surface on the opposite side rises to a temperature close to the temperature of the one surface and the liquid falls on the surface of the opposite side and flows therealong in the same manner as when it falls directly on the one surface. As a result, the liquid is evaporated, and the heat generated by the semiconductor device can be removed in a necessary amount from the one surface via the surface on the opposite side and the separation member.

Furthermore, the separation member can also partition the electric structural components, including the semiconductor devices, from the surface on the side opposite to the one surface in the separation member that is affected by fine particles of the liquid produced by the liquid discharge means. Therefore, the risk of the electric components malfunctioning due to short circuiting, or being rusted and damaged can be completely prevented, this risk being due to the fact that the liquid is evaporated, the air in the burn-in apparatus becomes humid, this high-humidity air is cooled to a temperature below the dew point by the upper portions of the surrounding structure, which is at a temperature close to normal temperature, in the sealed space that is usually sealed with the surrounding structure in order to cool the semiconductor device, moisture in the cooled air forms condensate, and the resultant liquid flows down on the electric structure components located therebelow, or that sometimes the liquid is not completely evaporated and liquid pools are formed below.

The third aspect of the invention provides the configuration with the one surface facing downward. Therefore, the semiconductor device can be attached so as to face downward and the electric structural components coupled to the device can be disposed above the device. As a result, as described above, the risk of the electric components malfunctioning due to short circuiting, or being rusted and damaged can be prevented even when liquid pools are formed therebelow due to incomplete evaporation of the liquid.

In this case, the fine particles of the liquid are sprayed upward and fall on the one surface of the semiconductor device facing downward, but because the liquid is discharged as fine particles at a sufficiently high speed, free fall from gravity is not a problem. Therefore, when the liquid falls on the one surface, even the part thereof that was not instantaneously evaporated does not move in the direction of falling down under gravity; the trajectory thereof is deflected from the propagation direction at the time it reached the one surface and the liquid moves in the direction along the one surface, while being reliably evaporated in this process.

In accordance with the fourth aspect of the invention, there are provided temperature detection means for detecting the temperature of the semiconductor device, flow rate adjustment means capable of adjusting the flow rate of the liquid, and control means for controlling the flow rate adjustment means so that the temperature detected by the temperature detection means becomes the target temperature. Therefore, when the semiconductor device reaches a stationary operation state, manual control becomes unnecessary, labor can be saved, and reliability during operation can be increased.

In the fifth aspect of the invention, water is used as the liquid and a water supply means and a water discharge means are provided; thus, various excellent effects are obtained through the unparalleled use of water as a heat transfer medium for cooling semiconductor devices. Specifically, the following are among the various effects that can be obtained: because the amount of removed heat, including the latent heat of water, is several times the amount of heat removed with a heat transfer medium such as a liquid coolant, the cooling effect is considerably greater, and this is extremely advantageous for cooling devices that generate a large amount of heat; obtaining the water is easy, the cost is low, and the cost of operation is low; in this case, even when the water used is pure water in order to keep the one surface of the semiconductor device that the water hits cleaner, pure water is easily and inexpensively obtained at a semiconductor device manufacturing plant; disposal after use is easy; a refrigerator is not necessary as is the case when liquid coolant is used, the configuration of the apparatus is simplified, and the cost of the apparatus becomes cheaper.

Because, in the cooling of semiconductor chips that have been mounted, it is desirable to avoid a high temperature state to the extent possible, it is necessary to use a liquid coolant with a low evaporation temperature to enable latent heat cooling, but with a burn-in apparatus, the burn-in temperature is sufficiently high at a usual level of 150° C., and so water, which has a high evaporation temperature, can be used. For the fifth aspect of the invention, this point was kept in mind; by combining a burn-in apparatus and high-degree latent heat cooling through use of water, many advantageous effects, such as those described above, could be obtained, including reliable cooling of devices generating a large amount of heat.

BRIEF DESCRIPTION OF THE DRAWINGS

Accompanying the specification are figures which assist in illustrating the embodiments of the invention, in which.

DETAILED DESCRIPTION OF THE INVENTION

Figure 1:
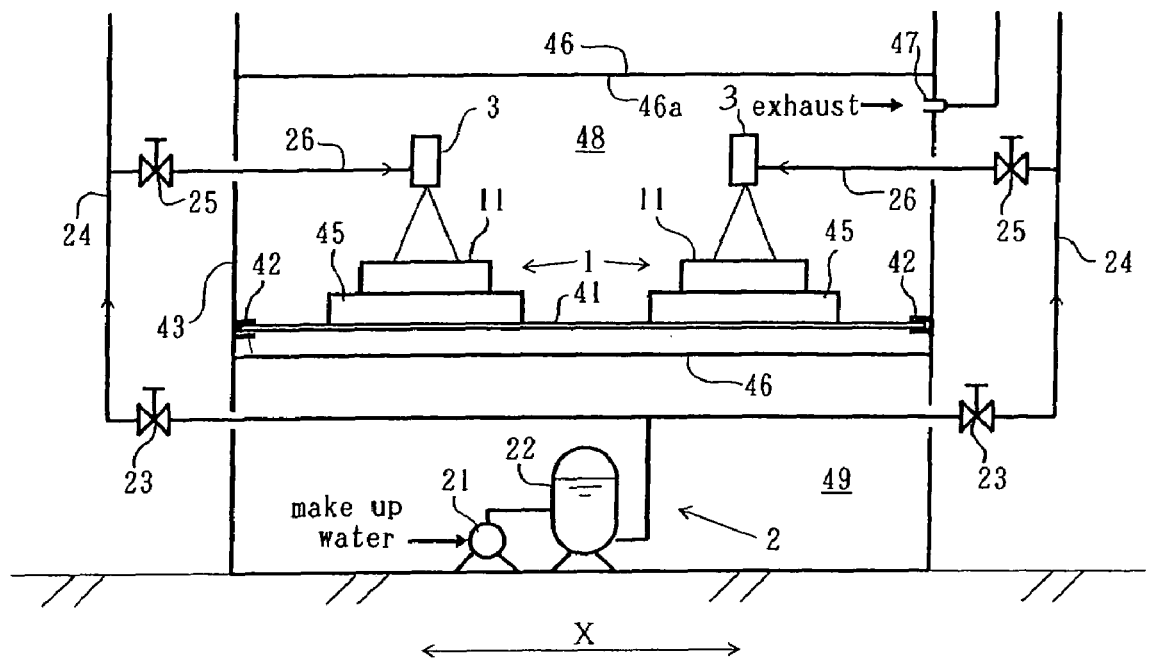
FIG. 1 is an explanatory drawing illustrating an example of the entire configuration of the burn-in apparatus employing the present invention, (a) and (b) are the front and plan views of the inner side thereof.
Figure 1:
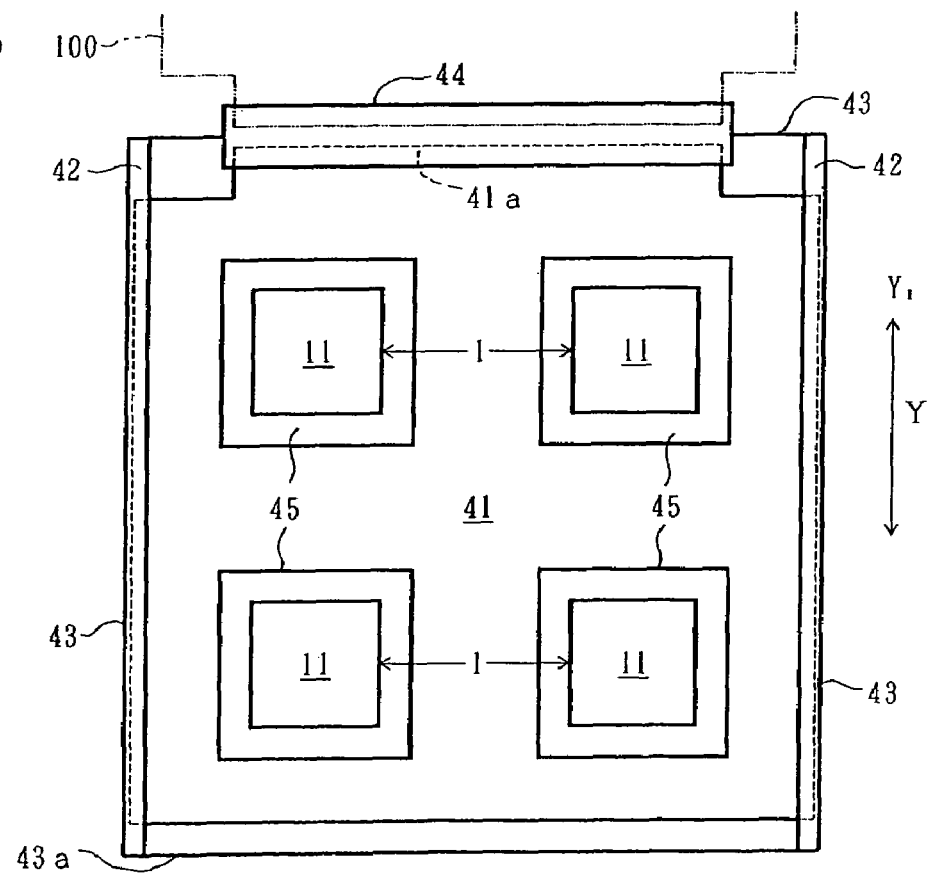
Figure 2:
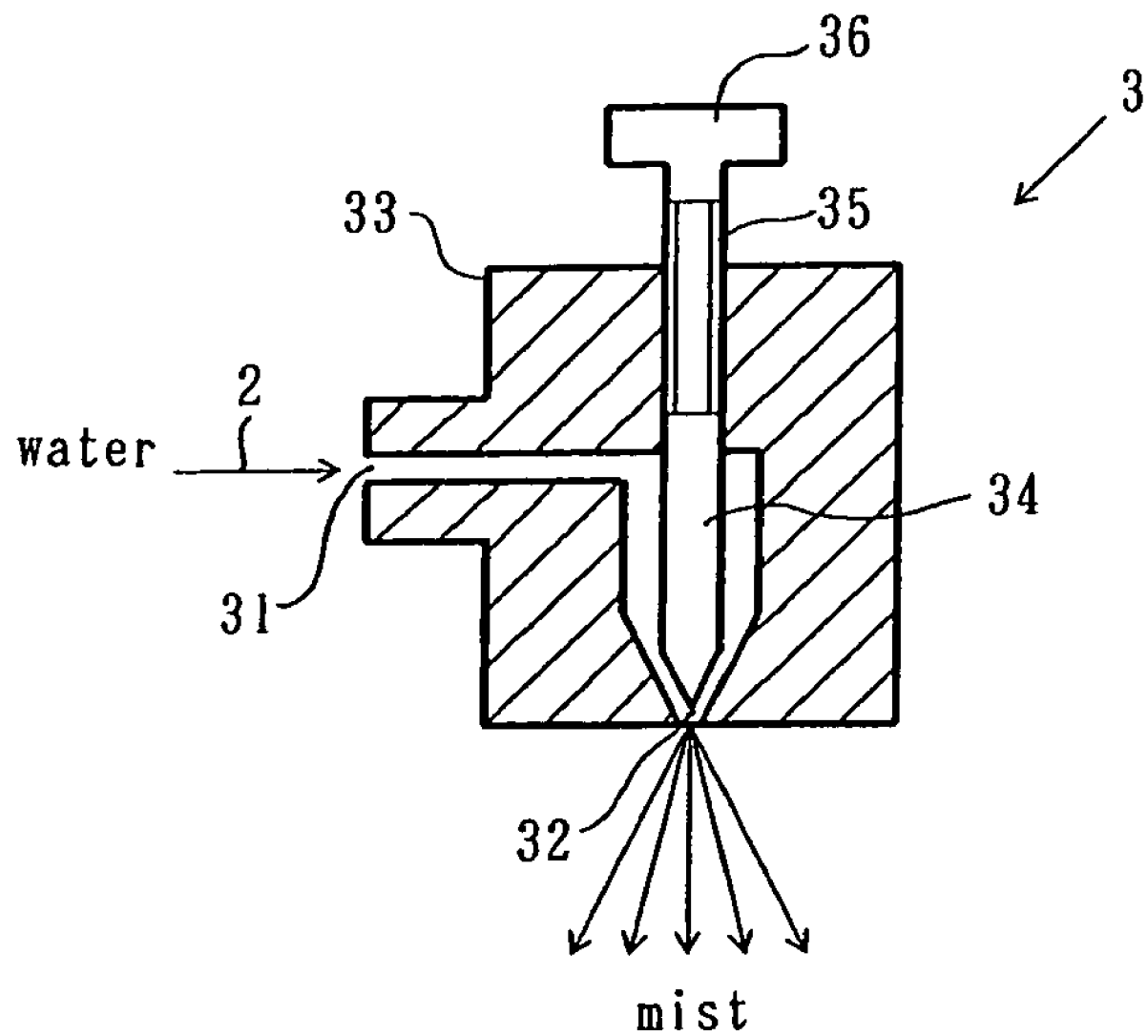
FIG. 2 is a cross-sectional view illustrating an example of the sprayer used in the aforementioned apparatus.

FIG. 1 shows an example of the entire structure of the burn-in apparatus employing the present invention. FIG. 2 illustrates a configuration example of a sprayer as water discharge means used in this burn-in apparatus.

The burn-in apparatus of the present example is an apparatus that can cool a device 1 that is a semiconductor device to a temperature t, this device 1 comprising an upper surface 11, in the present example a flat surface, and having been formed so that it generates heat when electric current is passed therethrough, so that the temperature thereof rises to a temperature higher than the temperature t, which in the present example is the burn-in temperature of about 150° C., and so that the temperature of the upper surface 11 also rises accordingly. This burn-in apparatus comprises a water supply system 2 as water supply means and a sprayer 3 as water discharge means.

A burn-in board 41 (referred to hereinbelow simply as "board 41") for carrying the device 1, a guide groove 42 for inserting the board into the burn-in apparatus and removing it therefrom, a case 43, and a connector 44 for electric connection to a relay board 100 are provided as the usual structural components of the burn-in apparatus. The board 41 is composed of a printed substrate, a socket 45 is mounted thereon, and an edge connector 41a for detachable connection to the connector 44 is formed at the distal end thereof. As burn-in test equipment, in addition to the burn-in apparatus, a driver/test board (not shown in the figure) for connection to the relay board 100, a relay board, and a control board are installed in the order of description outside the burn-in apparatus. These components make it possible to supply power to the device 1, send necessary electric signals, and actuate the device 1 for a burn-in test.

The figure shows the components of one stage of the burn-in apparatus carrying four devices 1, but usually a multistage stacked configuration is used which is composed, for example, of 5 to 10 identical stages with components of the same structure. Each stage is a sealed space 48 surrounded by the case 43 having a door section 43a and a partition plate 46 with an evacuation vent 47 opened therein. An equipment installation section 49 is disposed below the first stage, and main mechanical components of the water supply system are provided in this section. The case 43 has a thermally insulated structure, except part of the equipment installation section 49.

In a burn-in apparatus in which a multiplicity of devices 1 are carried in multiple stages, the board 41 may have a structure that is mechanically detachably attached to the connector 44. In this case, the printed substrate is provided with an additional reinforcing structural section and a coupling portion of the mechanism used for detachable attachment to the connector is provided in this section.

The device 1 is of a high heat generation type that generates an amount of heat of about 300 W in a conductive state thereof, but similarly to the usual devices, has a structure comprising a multiplicity of pins 12 shown in FIG. 3(a) around it, and when the device is detachably attached to the burn-in board, these pins are detachably attached to a socket 45. The upper surface 11 is formed from a metal with good thermal conductivity such as copper plated with nickel so as to provide for good heat dissipation and is, for example, a wide flat square surface with a side of 4 cm. The lower surface 13 is usually made of a heat-resistant resin.

Because temperature control is important for the device 1 of such a high heat generation type, some of such devices have a structure with a temperature sensor 14 incorporated therein. In this case, the sensor 14 is connected to the appropriate pins of a multiplicity of pins 12 and the leads thereof are led out as an external wiring from a control board (not shown in the figure) via a printed wiring of the board 41 and used for temperature display or temperature control. When the temperature sensor 14 is not incorporated in the device 1, a structure is used in which a provisional temperature sensor 15 integrated with the pin 15a, as shown in FIG. 3(b), is mounted on the lower surface 13 and similarly connected to the printed wiring of the board 41.

The water supply system 2 is means capable of supplying by pressurizing the water that serves as a heat transfer medium for cooling; it comprises a pump 21, a tank 22, a main valve 23, an all-stage common system 24, an individual valve 25, and an individual system 26, and it supplies pressurized water to the sprayer 3. For the water, use of pure water is preferred, and usually this is what is done. In semiconductor manufacturing plants, pure water is used in large quantities and may be procured at a low cost. The tank 22 is preferably a pressure tank rated at a pressure of about 0.5 MPa. For this reason, the pump 21 is usually automatically started and stopped so as to maintain the water surface in the tank 22 within a constant range. The tank 22 may be an open-air head tank and the pump 21 may be provided on a slip stream position of the tank 22.

Water at normal temperature is usually used as the water, but the temperature of the supplied water can be adjusted to the appropriate temperature by providing the water supply system 2 with a heat exchanger. For example, a heater may be provided to heat the water and to adjust the temperature thereof automatically or manually to about 80° C. In such a case, when mist is generated and it falls on the device 1 to cool the device, as described hereinbelow, the sensible heat cooling effect of water is decreased, but because the water temperature approaches the saturation temperature, the water is easily completely evaporated when it falls on the device 1, a latent heat cooling effect can be reliably obtained, and the occurrence of problems associated with insufficient evaporation of mist can be prevented.

The sprayer 3 is a means provided so that the water is supplied from the water supply system 2, discharged as a reduced pressure, and turned into fine particles to hit the upper surface 11 of the device 1. As shown in FIG. 2, one example of a schematic structure thereof, it comprises a water inlet hole 31, water outlet hole 32, a tube 33 out of which these are formed, a needle valve 34 capable of adjusting the amount of water, an adjustment screw 35 and an adjustment knob 36. Other configurations may be used as the sprayer 3, such as one in which the needle valve 34 is not provided and the outlet hole 32 is configured as a fixed nozzle or orifice.

The above-described burn-in apparatus operates and demonstrates the effect thereof in the manner as follows.

When a burn-in test of the device 1 is conducted, first the water supply system 2 is operated. In the water supply system 2, the pump 21 is operated automatically, the water level in the tank 22 falls within the range of levels of rise and fall that has its center a position shown in FIG. 1, and the water is supplied such that the pressure comes within a range of about 0.5-0.6 MPa. The water is taken, for example, from a pure water distribution line at a semiconductor manufacturing plant, and is usually at about normal temperature. The individual valves 25 respectively provided in each device of the water supply system 2 are adjusted from the beginning to a degree of opening according to which the same amount of water is supplied to each of the sprayers. If the amounts of heat generated by the devices 1 are not the same, then they are adjusted accordingly.

Then, the devices 1 are attached to the sockets 45 mounted on the board 41, both ends of the board 41 in the width X direction are inserted into the guide grooves 42, the board 41 is inserted in the longitudinal direction $Y_1$ along the grooves, and the edge connector 41a located at the distal end thereof is inserted into the connector 44. As a result, the devices 1 are connected to the control board via the board 41, relay board 100, drive/test board (not shown in the figure) and relay board in the order of description.

As a result of the above-described operations, a state is assumed in which a burn-in test can be implemented. The test apparatus is operated, power is supplied to the devices 1, necessary electric signals are applied, and the devices 1 are actuated. When the devices 1 are actuated, electric power of up to a maximum of about 300 W is consumed, heat is generated corresponding to the electric power, and the temperatures of the devices 1 rise gradually from their initial state of normal temperature.

The time when water is supplied and cooling by mist begins is determined by a detected temperature ta of the temperature sensor 14 that is normally incorporated in the device 1 or by a detected temperature $ta_1$ of the provisional temperature sensor 15 provisionally attached to the device 1. Specifically, when, for example, ta reaches 130° C. or so or $ta_1$ reaches 110° C. or so, the average temperature tf, as the temperature of the upper surface 11 of the device 1, will exceed 100° C. If water is supplied to the device 1 after tf has exceeded 100° C., then the water will evaporate and a large latent heat cooling effect will occur; the temperature ta or $ta_1$, is determined in order to make this possible.

If the devices 1 are the same, then this time is just about a fixed time $T_1$ from the start of the flow of electric current. Therefore, one could measure $T_1$ from the beginning in burn-in tests at a burn-in apparatus manufacturing factory or a device manufacturing plant, and set the main valve 23 to open according to $T_1$ by manual operation, a timer, or the like.

Figure 4:
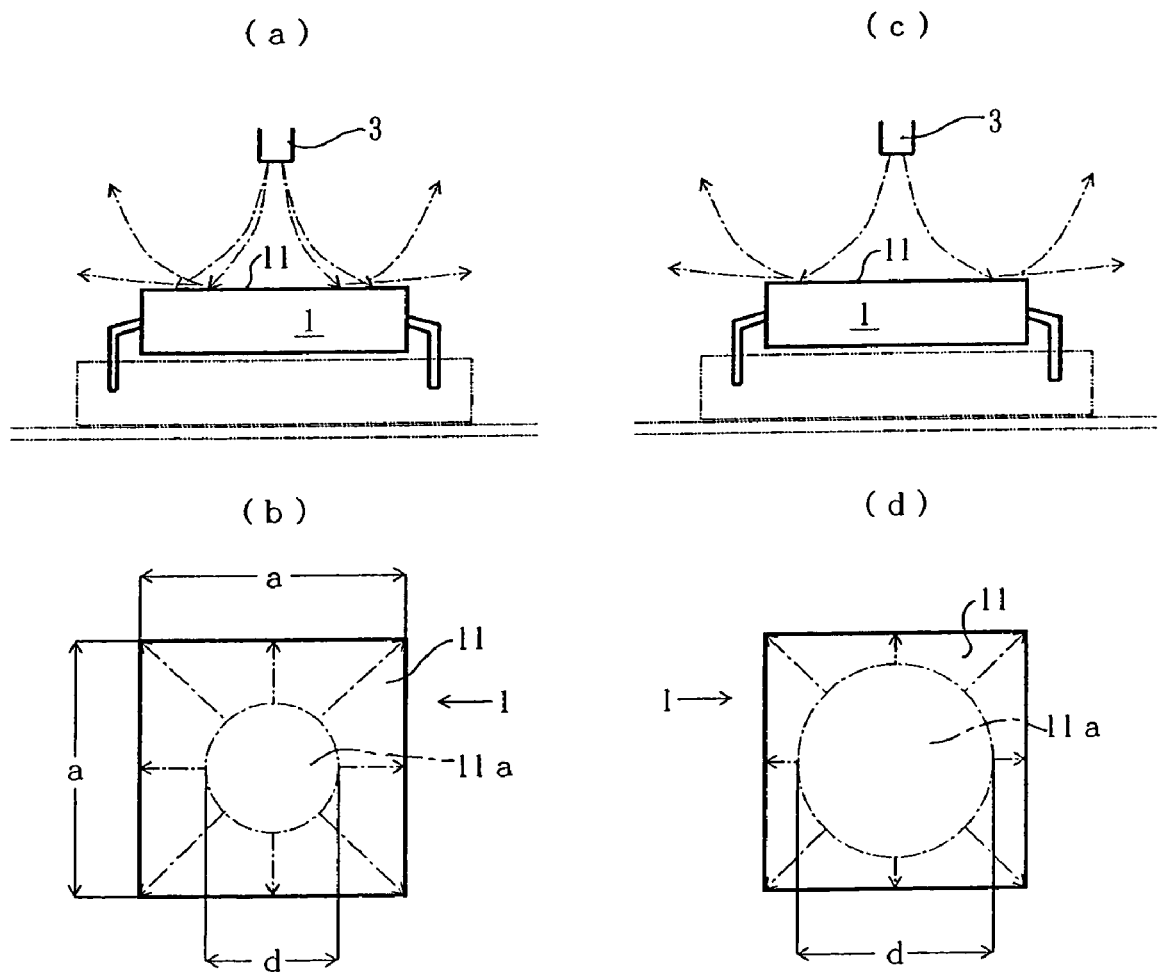
FIGS. 4(a) through (d) are explanatory drawings illustrating the state in which the mist falls on the device.

As described hereinabove, if tf exceeds 100° C., the main valve 23 for water is opened. The degree of opening of the valve at this time is set to around ½ to ¾. When the main valve 23 for water is opened, the water enters the sprayer 3 from the water inlet hole 31, at a pressure of 0.5 MPaG or so, and is ejected at high speed from the water outlet hole 32, which has been sufficiently narrowed to a nozzle condition by the needle valve 34, where the pressure of the water is reduced; the water expands radially and turns into fine particles in the apparatus of the present example, tiny particles of diameters of 50-100 microns or so (hereinbelow referred to provisionally as "mist") and these strike within the area of the circle with diameter d on the upper surface 11, as shown in FIG. 4.

As shown in FIG. 4(b), for the upper surface 11 that is a square of one side a=40 mm of the device 1, it is desirable that the diameter d be larger than about ½ of a; diameter d is determined by such factors as the amount of water flow, the structure, size, and type of the sprayer 3, the placement thereof, and the diameter of the particles of mist; as shown in FIGS. 4(c) and 4(d), the various conditions are selected so that, for example, d=3a/4 or so. If done in this way, mist strikes a corresponding portion of the upper surface 11.

At this point, the average temperature tf of the upper surface 11 exceeds 100° C., and so the fine mist is immediately heated by heat transfer from the upper surface 11 and evaporated. Furthermore, any mist that was not evaporated instantaneously upon striking the upper surface 11 moves radially from inside the area of the circle with diameter d to the periphery thereof, as shown in FIGS. 4 (b) and (d), by means of velocity components along the upper surface 11, as shown in FIGS. 4 (a) and (c), absorbs heat from the surface 111 in the process of this movement, and evaporates completely on the surface 11. It is also possible to employ a configuration such that the placement of the sprayer 3 is manually or automatically adjusted vertically in a direction that is perpendicular to the upper surface 11 and the range of d can be adjusted to a certain degree.

By means of the cooling action of the mist as described above, the extent of the temperature rise of the device 1 that generates heat at 300 W is mitigated, but because the main valve 23 is not fully open, the temperature of the device 1 continues to rise. For this reason, if ta approaches the burn-in temperature that is t=150° C., for example, if it reaches 145° C., the main valve 23 is fully opened. Through this operation, ta becomes t once a fixed period of time has passed, and in this state, the amount of heat generated by the device and the amount of heat removed by the mist are in balance; from this point on, an operational condition can be obtained wherein device 1 is maintained at about this burn-in temperature t. The individual valve 25 has been opened to a degree adjusted in advance so that just enough water is supplied to keep the device 1 at t when the main valve 23 is fully opened.

With this type of cooling that uses the evaporation heat of mist, assuming that the mist goes from a normal temperature of 20° C. to 100° C. and evaporates, and that all of the heat generated by the device that generates 300 W of heat is removed by sensible heat and latent heat of evaporation at the time of the rise in temperature of the water, because the latent heat of evaporation is large, the amount of water necessary is about 0.45 kg/hr, and even when 20 devices generating a large amount of heat are assumed to be burned in with one burn-in apparatus, the amount of water necessary is only the small amount of 9 kg/hr. Thus, the excessive amount of heat from devices that generate a large amount of heat up to 300 W, which could not be handled by conventional air cooling, is removed, and operation can take place that maintains a target temperature of the 150° C. or so that is the temperature at the time of burn-in of the device.

A stationary burn-in operation that maintains the internal temperature t of the device 1 at about 150° C. is continued for about 48 h. Even in this type of stationary operation, the temperature t fluctuates unavoidably according to fluctuations in the operational environment, etc., and so it is necessary to conduct accurate burn-in tests so that the fluctuations do not exceed a fixed range. For this reason, the degree of opening of the main valve 23 or the individual valve 25 is made to increase or decrease by adjustment. Because, in this adjustment, it is enough to increase or decrease the degree of valve opening just slightly, fluctuations in the pressure of the water supplied to the sprayer 3 are small, and accordingly there are no large fluctuations in the size of the water particles ejected from the outlet hole 32.

When the burn-in time has passed and the test is ended, the power supply to the device is lowered until at last the electric current is stopped. At this time, ta drops considerably, and so the main valve 23 is closed in correspondence thereto. When one burn-in test has ended, the edge connector 41a is pulled out from the connector 44, the burn-in board 41 is pulled out from the burn-in apparatus, and the device 1 is detached from the socket 45. This type of test is repeated; when the burn-in tests are at last to be ended, operation of the pump 21 is stopped.

Figure 5:
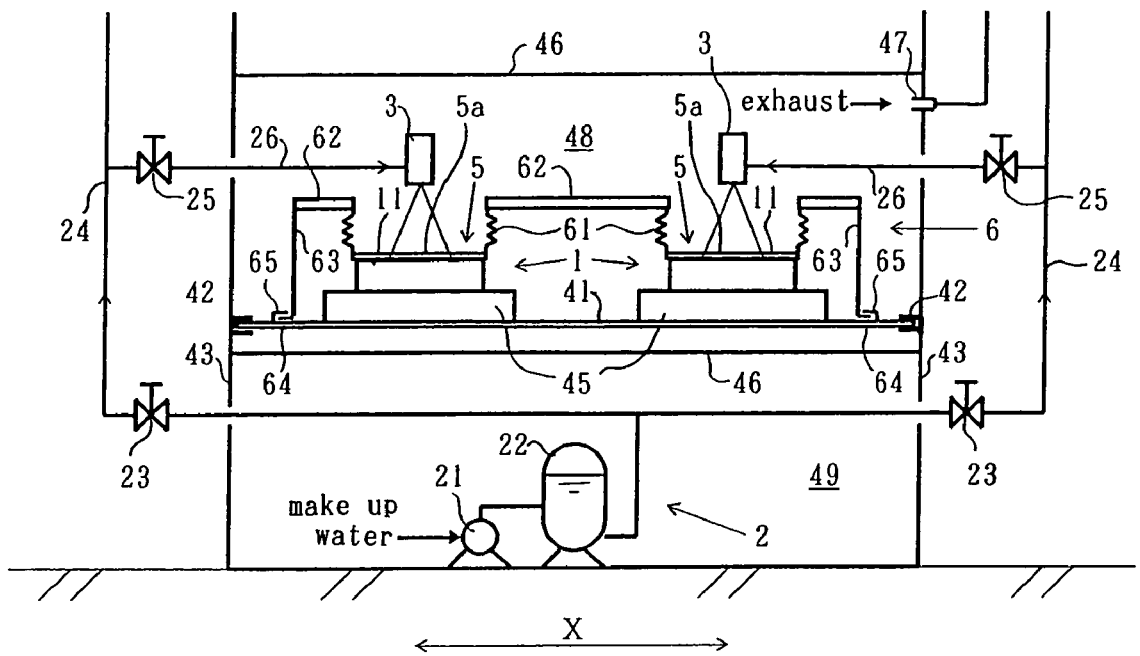
FIG. 5 is an explanatory drawing illustrating the entire configuration of another example of the burn-in apparatus employing the present invention; (a) and (b) are the front and plan views of the inner side thereof, (c) shows an example of the state during the attachment of the mounting structural section.
Figure 5:
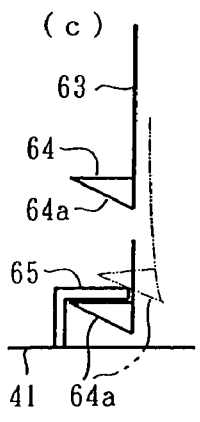
Figure 5:
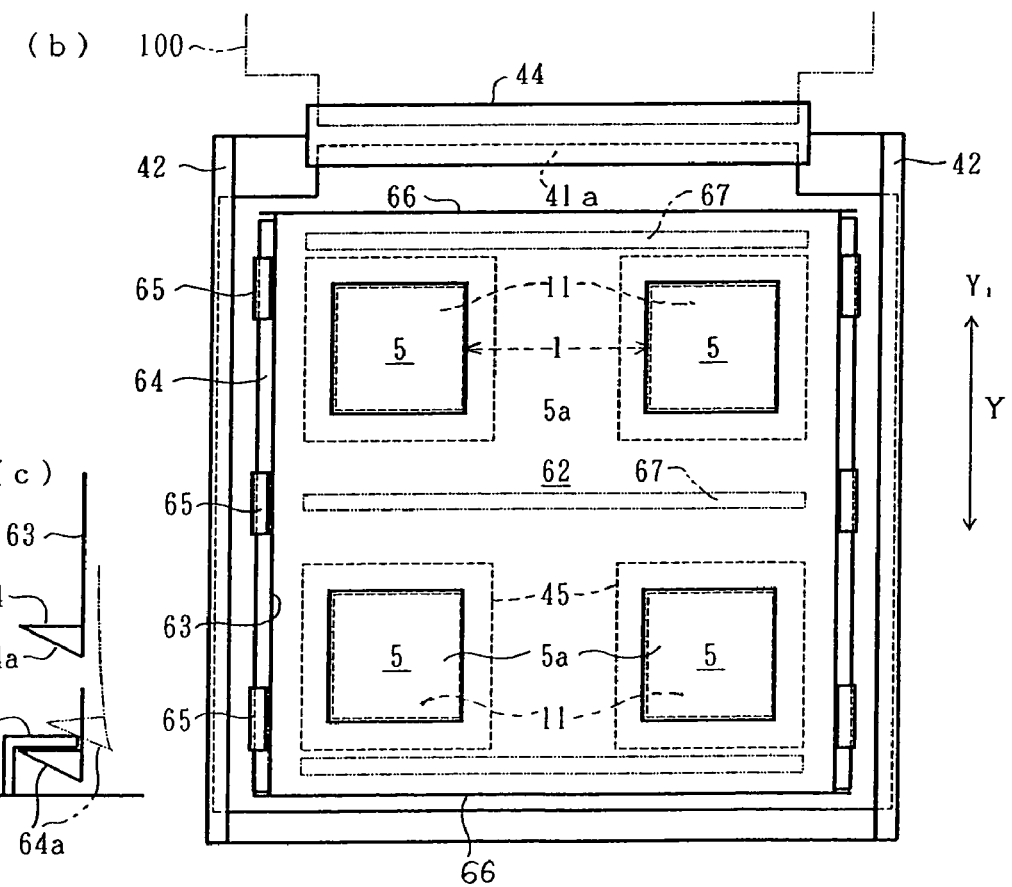

FIG. 5 illustrates another example of the burn-in apparatus employing the present invention.

The burn-in apparatus of the present example comprises a separation member 5 that can be pressed against the upper surface 11 of the device 1 and withdrawn therefrom and is provided so as to cover the upper surface 11 after being pressed against it and to facilitate the passage of heat from this surface. In the present example, a mounting structural section 6 for mounting the aforementioned separation member that can be pressed against the upper surface and withdrawn therefrom and that facilitates the passage of heat from the upper surface 11 after being pressed against it comprises a bellows 61 mounted on the circumference of the separation member 5 and serving as a member surrounding the separation member, a support plate 62 with a high rigidity having the bellows mounted thereon, a side plate 63 mounted so that the support plate 62 can be fixed to the burn-in board 41 and so as to partition the device 1 and the closed space 48, a foot plate 64, a lock member 65 mounted on the burn-in board 41 so as to be pressed against the foot plate 64 and fix it when it is inserted, and front and rear plates 66 that are separated from the side plate 63 to prevent the restriction thereof and serve similarly as partitions. If necessary, a lateral beam 67 shown by a two-dot-dash line in FIG. 5(b) can be mounted on the support plate 62 to increase the flexural rigidity thereof in the X direction.

Figure 6:
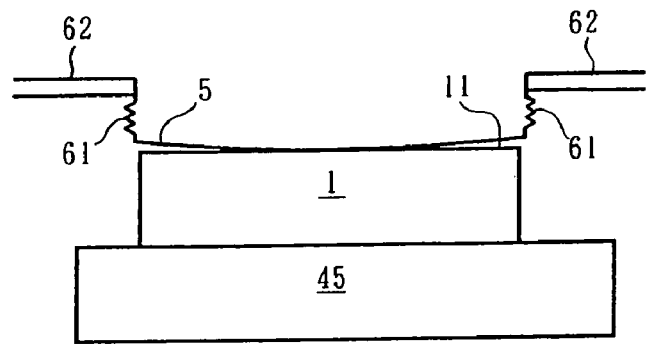
FIGS. 6 (a) through (f) are explanatory drawings illustrating another example of the pressure contact structure of a separation member.
Figure 6:
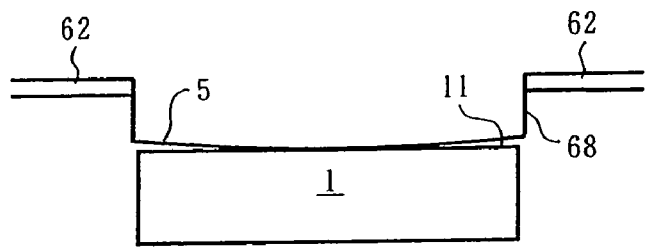
Figure 6:
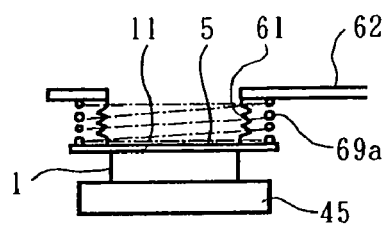
Figure 6:
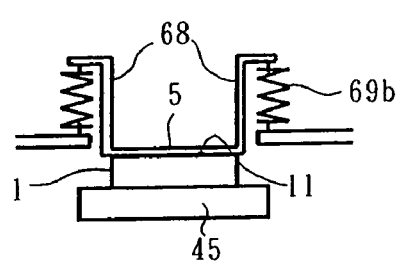
Figure 6:
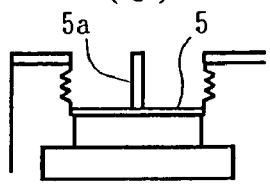
Figure 6:
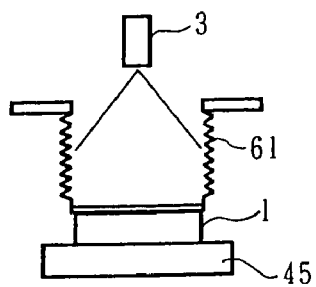

In the apparatus of the present example, the sprayer 3 is provided so that, of the surfaces of the separation member 5, the sprayed matter hits a surface 5a that is on the opposite side from the upper surface 11 of the device 1. The separation member 5 is usually made from a metal with good thermal conductivity, such as copper or aluminum, so as to facilitate the passage of heat, and is in the form of a thin sheet with a thickness thereof being, for example, about 1 mm or less. The thin sheet can be a flat sheet or, as shown in FIG. 6(a), a curved sheet that is made slightly convex on the side of the upper surface 11 so as to become a perfectly flat surface when pressed by an appropriate force to the upper surface 11.

When the separation member 5 is in the form of a curved sheet, it can be made from a very thin metal, for example, with a thickness of about 0.1 mm, but a heat-resistant resin that is deformed more easily than the metal may be also used with a further reduced curvature of the curved surface. When the separation member 5 is formed to have a curved surface, the surrounding member can be in the form of a simple plate material 68, as shown in FIG. 6(b), rather than in the form of an expandable member such as bellows. With such a curved separation member 5, the central section thereof is greatly deformed and the contact pressure force herein increases when a contact pressure is applied thereto. As a result, it is possible to cool effectively the central portion of the upper surface 11 of the device, which is unaffected from heat dissipation from the circumferential zone and which is where the temperature rises.

The side plate 63 is formed to have the dimensions such that when the foot plate 64 is inserted into the lock plate 65 and the mounting structural section 6 is mounted on the burn-in board 41, the side plate 63 can apply a force necessary to compress the bellows 61 and to press the separation member 5 against the upper surface 11 so as to provide for good transfer of heat of the device 1 from the upper surface 11 to the separation member 5. The foot plate 64 is made to be easily bendable to a degree facilitating the insertion of the foot plate 64 into the lock plate 65.

The above-described separation member 5 and the mounting structural section 6 thereof are used in the following manner to demonstrate the operation effect thereof.

If four devices 1 are mounted on the burn-in board 41 when a burn-in test is conducted, the mounting structural section 6 onto which the separation member 5 was mounted so as to protrude downward is placed so that the separation member 5 comes into contact with the four devices 1, the distal end sides of the side plates 63 are moved closer to each other, while compressing the bellows 61 from above, the original state is then restored and the foot plate 64 is inserted into the lock plate 65.

As a result of this operation, the separation member 5 is pressed against the upper surface 11 of the device by the elastic force of the bellows 61, and the mounting structural section 6 is also attached to the burn-in board 41. These operations are easy to conduct. Furthermore, as shown in FIG. 5(c), if an inclined portion 64a is provided at the foot plate 64, the operation of the side plate 63 and foot plate 64 is further facilitated, because when the two plates are pushed down from above, the inclined portion 64a moves as shown by the figure two-dot-dash line and the foot plate 64 can be inserted below the lock plate 65. The inclined portion may be also provided on the lock plate 65.

Subsequent operations are identical to those explained with reference to the apparatus shown in FIG. 1. With the apparatus of the present example, the mist sprayed from the sprayer 3 does not fall directly on the upper surface 11 of the device. Instead a structure is provided in which heat of the upper surface 11 easily passes to the upper surface of the separation member 5. Therefore, the temperature of this upper surface rises to a temperature close to the temperature of the upper surface 11 of the device and when the mist falls on the surface 5a on the opposite side serving as the upper surface of the separation member in the same manner as shown in FIG. 1, the mist is heated, the mist is evaporated, and the necessary amount of heat generated by the device can be removed from the upper surface 11 of the device via the surface 5a on the opposite side and the separation member 5.

On the other hand, because the mist does not fall directly on the upper surface 11 of the device, the upper surface 11 is not affected by the collisions with the mist and the possibility of contamination or discoloration of the upper surface 11 can be reliably prevented. Furthermore, the effect of mist on the electric structural sections such as the device 1, socket 45, and burn-in board 41 is eliminated.

Thus, it is possible to prevent completely the process in which the mist is evaporated, the atmosphere of the closed space 48 that contained this becomes highly humid, and this highly humid air, until it is discharged from the evacuation vent 47, is partially cooled to a temperature below the dew point and moisture in the air forms condensate on the upper partition plate 46a serving as a ceiling among the partition plates 46 that have a low temperature inside the closed space 48, and the condensate flows down onto the electrical structural sections located below, or in which sometimes moisture in the humid air forms condensate directly on the electrical structural sections, or in which water pools are formed therebelow due to insufficient evaporation of mist, this process causing the electric sections to malfunction due to short circuiting or inducing rust and damage thereof.

Other appropriate structures, such as those shown in FIGS. 6(c) to (f) and FIG. 7, can be used for pressing the separation member 5 against the surface 11 of the device. In the structure shown in FIG. 6(c), a compression spring 69a is added to augment the elastic force of the bellows 61 that serves to press the separation member 5 to the upper surface 11 of the device 1 when this elastic force is insufficient. In the structure shown in FIG. 6(d), a plate material 68 is used in place of the bellows as a member surrounding the separation member 5, and the separation member 5 is pressed against the upper surface 11 by applying a tensile force with a tension spring 69b. Employing such contact pressure structures makes it possible to press the separation member against the upper surface 11 with a sufficient and necessary force, further improving the heat transfer therebetween.

In the structure shown in FIG. 6(e), a rod-like heat-dissipating fin 5a is fixedly attached to the separation member 5. As a result, cooling performance of the device 1 can be further improved. Furthermore, in the structure shown in FIG. 6(f), the mist can be also sprayed on the bellows 71 by slightly raising the sprayer 3 and widening the spraying angle. As a result, the bellows 61 acts as a heat transfer body of enlarged surface area of heat exchange and the cooling effect of the device 1 can be improved.

Figure 7:
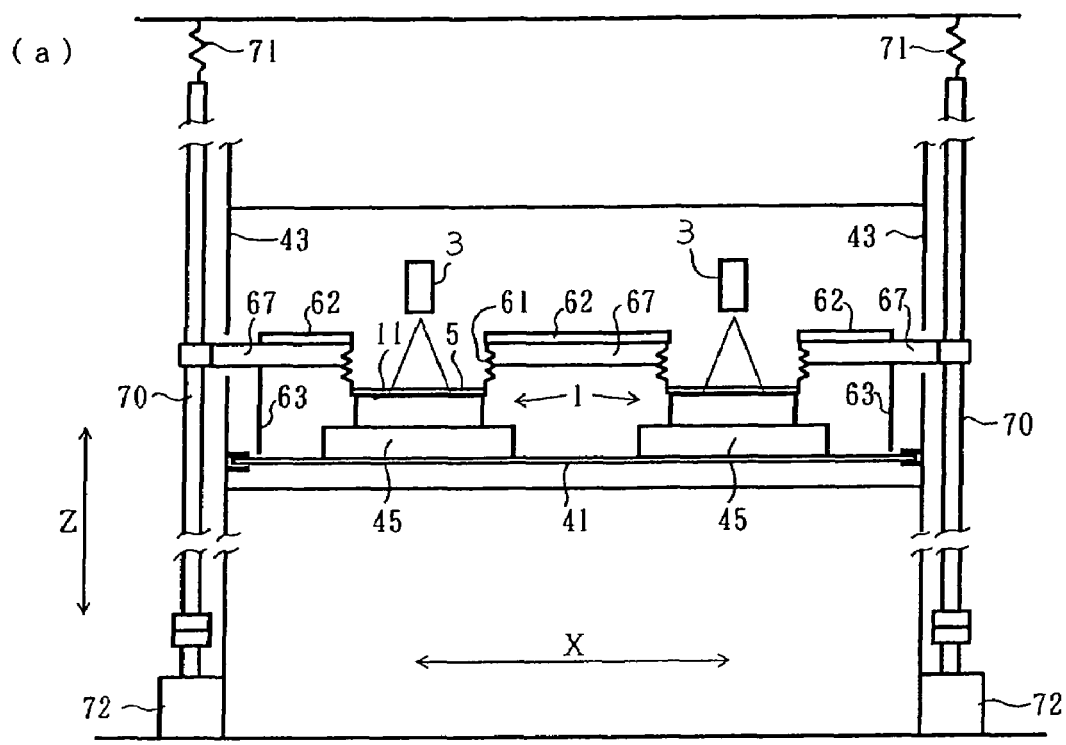
FIG. 7 is an explanatory drawing illustrating an example of a mechanized pressure contact structure; (a) and (b) are the front and plan views of the inner side thereof.
Figure 7:
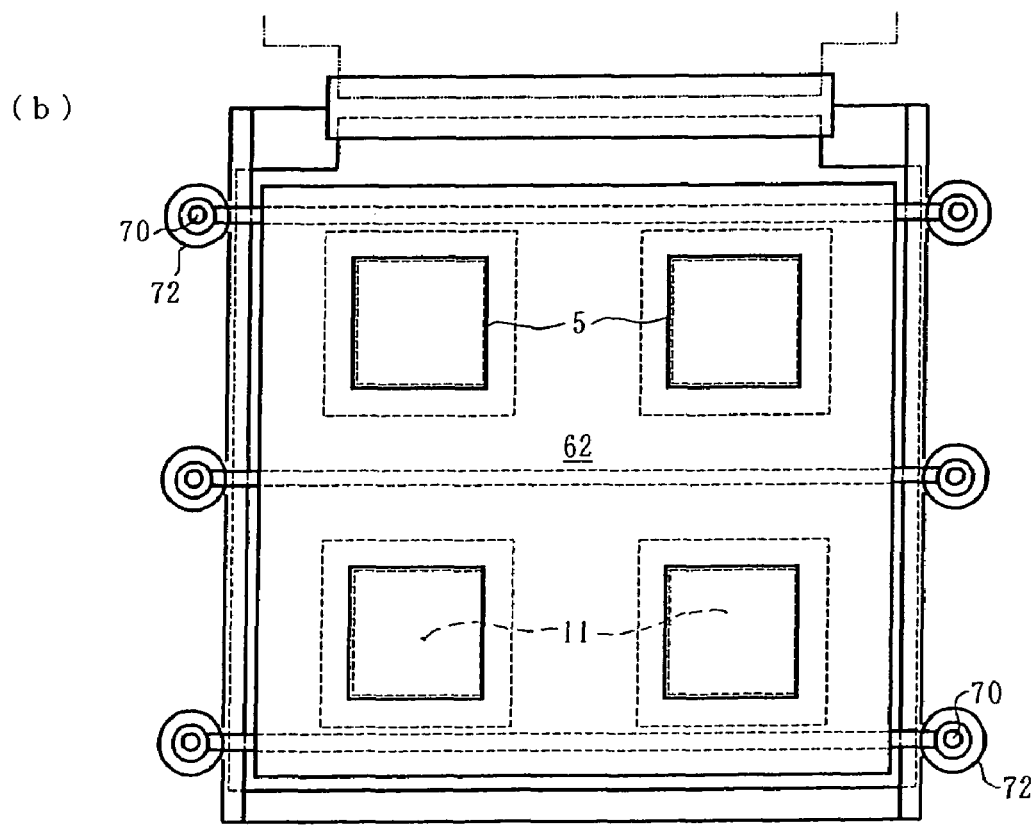

FIG. 7 shows an example of the structure for pressing the separation member 5 against the upper surface 11 of the device with a mechanical force.

In the structure of this example, the lateral bar 67 attached to the support plate 62 extends in the X direction to the outside of the case 43, both end portions thereof are joined to shafts 70 extending in the vertical Z direction, the shafts 70 are suspended by the upper ends thereof with the springs 71, while being appropriately guided in the vertical direction, and the lower end positions thereof can be moved in the Z direction by vertical movement apparatuses 72 such as cylinder mechanisms. A plane frame joined to the shafts on one side or to all the shafts and moved and guided in the Z direction may be provided and this frame may be moved in the vertical direction with vertical movement apparatuses 72 (one apparatus at each side or one apparatus for all the shafts), rather than moving each shaft 70 in the vertical direction with separate vertical movement apparatuses 72.

If the mounting structural section 6 is used in such an apparatus, when a burn-in test is conducted, the separation member 5 can be pressed against the upper surface 11 by simple operations comprising the steps of detachably mounting the device 1 on the board 41 in the same manner as in the usual apparatus, mounting the board 41 on the test area such as a burn-in apparatus or burn-in rack, and then actuating the vertical movement apparatus 72. Thus, the operations of applying pressure to the separation member or releasing the pressure applied thereto can be further facilitated.

Figure 8:
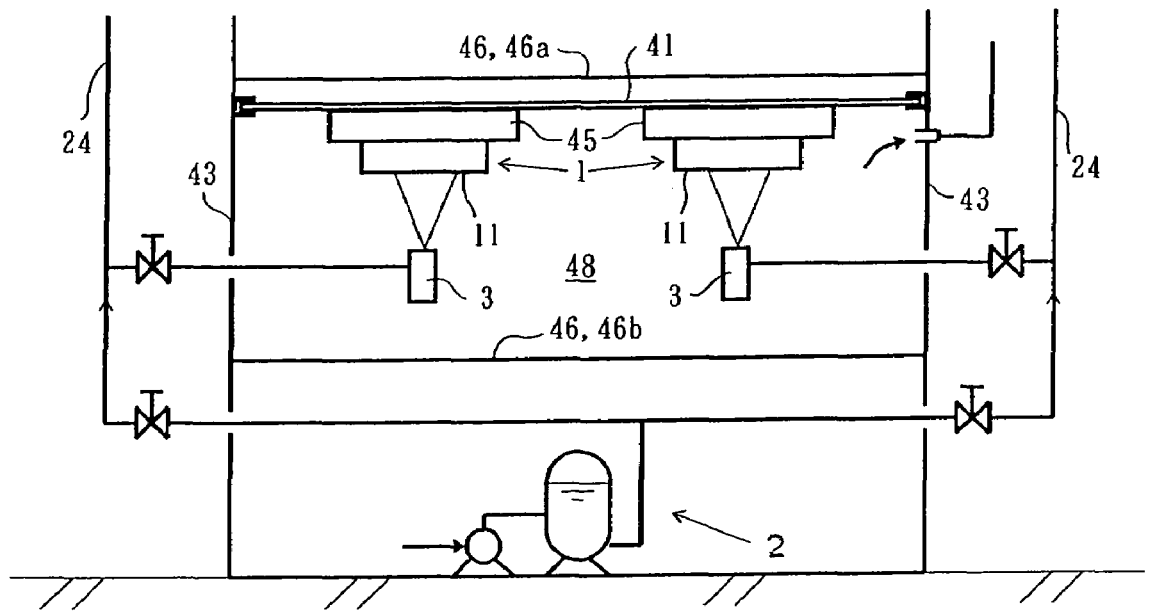
FIGS. 8 (a) and (b) are explanatory drawings illustrating the entire configuration of another example of the burn-in apparatus employing the present invention and also showing the front view state of the inner side thereof.
Figure 8:
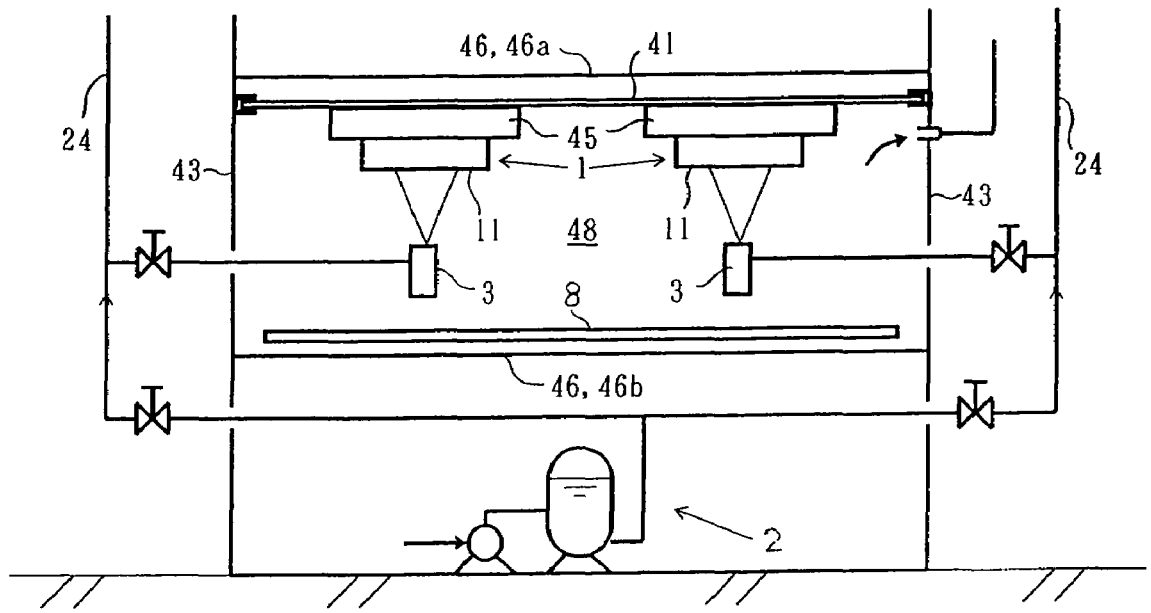
Figure 9:
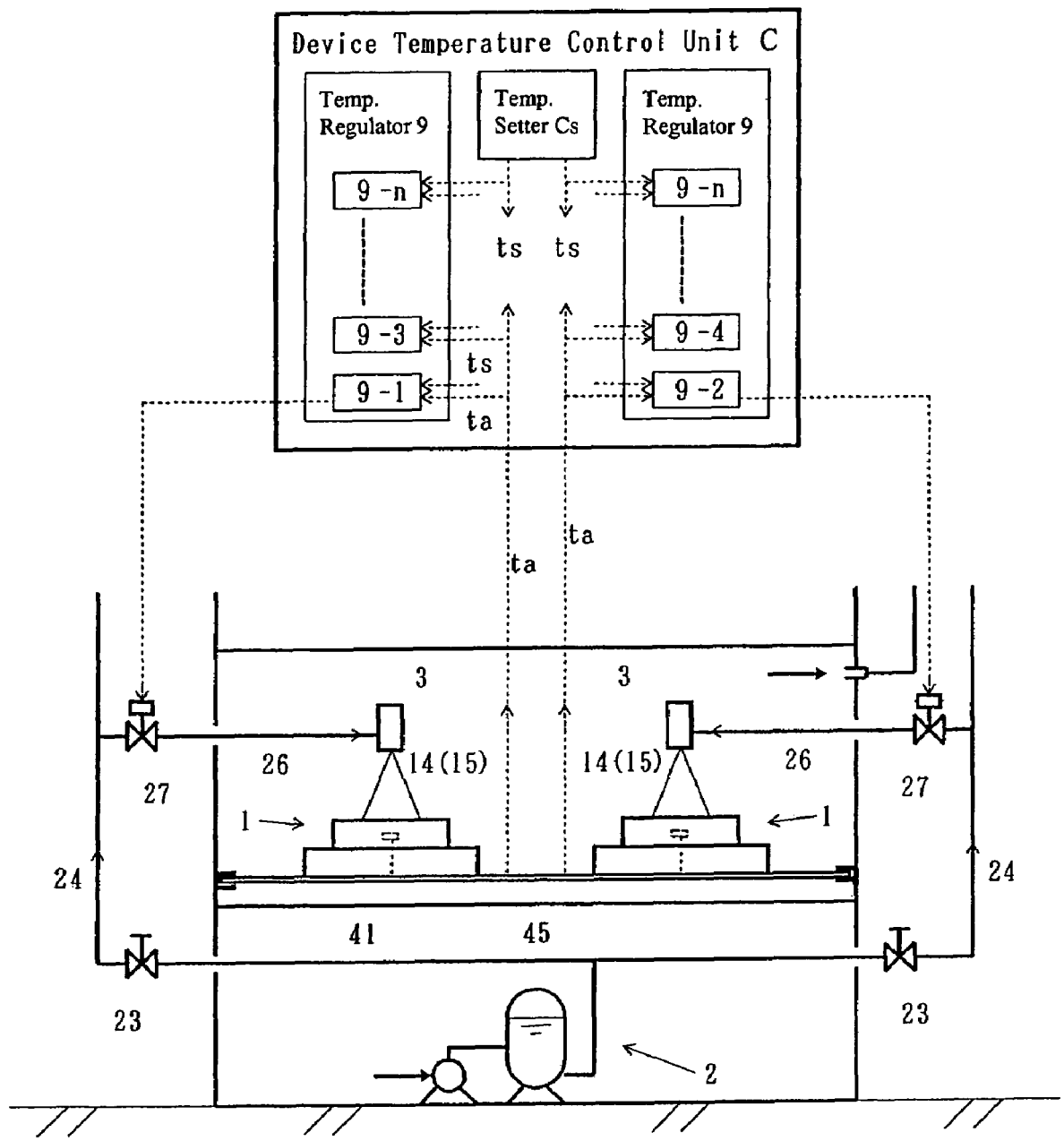
FIG. 9 is an explanatory drawing illustrating the control system of the burn-in apparatus employing the present invention.

FIG. 8 shows yet another example of the burn-in apparatus employing the present invention. In this figure, some of the reference symbols denoting the structural components identical to those shown in FIG. 1 are omitted.

In the apparatus of the present example, as shown in FIG. 8(a), the sprayer 3 is disposed in a closed space 48, which is the space surrounded by the partition plate 46 and case 43 as a structural body, and the upper surface 11 of the device 1 faces downward.

In order to obtain an apparatus in which the upper surface 11 of the device 1 faces downward, a structure is employed in which the inside of the closed space 48 shown in FIG. 1(a) and the components located therein are turned over in the vertical direction. Thus, the front and rear surfaces of the burn-in board 41 are inverted in the position below the upper partition plate 46a of the partition plates 46, a socket 45 is mounted downwardly on the front surface side of the burn-in board, the device 1 is attached thereto, the upper surface 11 of the device 1 is oriented downward, the sprayer 3 is located below the upper surface, and the sprayer 3 is also turned over in the vertical direction so as to spray the air and mist upward on the upper surface 11, which faces downward.

The apparatus of the present example operates in exactly the same manner and demonstrates the same operation effect as the apparatus of FIG. 1. Thus, in the apparatus of the present example, the mist is sprayed upward and falls on the upper surface 11 facing downward, and though the mist is water with a large specific gravity, a small particle diameter is obtained, the particles have a sufficiently small weight, and the mist fall on the upper surface 11 at a high-speed. Therefore, gravity produces practically no effect on the movement thereof. As a result, when the mist falls on the upper surface 11, even the part thereof that was not instantaneously evaporated does not move in the direction of falling down under gravity, the trajectory thereof is deflected from the propagation direction at the time of ejection, moves in the direction along the upper surface 11, without moving in the direction of falling under gravity, and is reliably evaporated in the course of this movement.

Furthermore, the upper surface 11, which is to be cooled, faces down, but heat at the time of heat generation by the device 1 is transferred by thermal conduction, and the convection produces practically no effect. As a result, the effects in the vertical direction are not correlated with heat transfer. Therefore, the cooling effect is absolutely identical to that produced when the upper surface 11 was cooled from above, as shown in FIG. 1.

Furthermore, with the apparatus of the present example, even when the separation member 5 and the mounting structural section 6 therefor, which are shown in FIG. 5, are not provided, the operation effect close to that of the apparatus shown in FIG. 5 can be obtained. Thus, the upper partition plate 46*a* assumes a position above the burn-in board 41 that is not affected by the air with high humidity and no water from condensation adheres to the surface of the plate. Therefore, the problem of the water from condensation falling down on the electric structural components is resolved. Furthermore, even in those cases where the water ejected from the sprayer 3 when the operation is started falls down in the form of droplets, without forming a mist, or the mist is not entirely evaporated and is collected below, the water or mist will be collected on the lower partition plate 46*b* serving as a floor of the partition plates 46. Therefore, the problems of the electric components malfunctioning due to short circuiting, or being damaged or rusted are almost fully resolved.

FIG. 8(*b*) shows an example, in which a cooling plate 8 is provided as a cooling structure that is cooled to a temperature lower than the temperature of the case 43 and partition plate 46 when the device 1 is cooled to the target temperature. This cooling plate 8 is cooled with a cooling water pipe or a coolant pipe of a simple refrigerator (not shown in the figures) so that the cooling plate assumes a temperature lower than the temperature of case 43 and partition plate 46 that are heated to a temperature higher than the normal temperature by a high-temperature environment inside the closed space 48.

If such a cooling plate is provided, water vapor forms condensate from the high-humidity air located inside the closed space 48, the humidity inside this space is removed, and the formation of condensate on electric components is prevented, thereby maintaining them in even better state.

FIG. 9 shows a configuration example relating to automation of the burn-in apparatus.

The apparatus of the present example comprises a temperature sensor 14, which was also shown in FIG. 3, as temperature detection means for detecting the temperature of the device 1, electric individual water valves 27 (referred to hereinbelow as "valves 27") as flow rate adjustment means for adjusting the flow rate of liquids, and a temperature regulator 9 as control means for controlling the valves 27 so that the temperature ta detected by the temperature sensor 14 becomes a set temperature ts of the device 1 when it is burnt in, this temperature serving as a target temperature. The temperature regulator 9 is incorporated in a device temperature control unit C.

As described hereinabove, the signals of the temperature sensor 14 are fetched from a control board (not shown in the figure) after passing from the device 1 to the socket 45 and from the burn-in board 41 via a relay board, but in the figure they are shown to be fetched from the burn-in board 41. The valves 27 are operated by motors (not shown in the figure) rotating in response to pulse signals supplied thereto.

Figure 3:
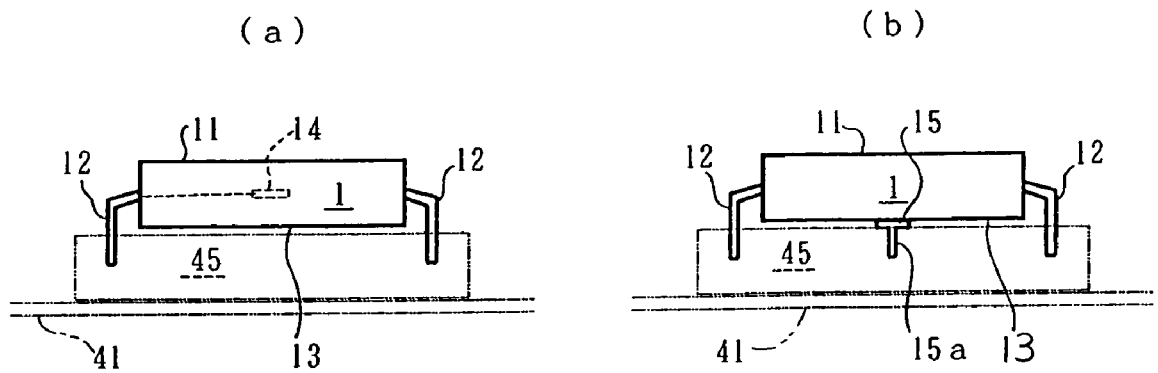
FIGS. 3(a) and (b) are explanatory drawings illustrating an example of the device cooled with the aforementioned apparatus.

The set temperature ts can be set to any temperature by a temperature setter Cs provided in the device temperature control unit C, for example to 150° C. This ts is transmitted to the temperature regulator 9. In the case where the device 1 does not contain the temperature sensor 14, a provisional temperature sensor 15 shown in FIG. 3 is mounted as temperature detection means, and control is so conducted that the detected temperature $ta_1$ thereof becomes a set temperature $ts_1$. In this case, the correspondence of $ts_1$ and ts is clarified in advance with a separate test or the like. The temperature regulator 9 is provided, for example, for every 20 devices with numbers 9-1 to 9-$n$ in correspondence with the temperature sensors 14 provided for each device.

With such a control unit, in a burn-in test conducted continuously within a long interval, manual operations, including preliminary adjustment of opening degree of individual valves in the case of the apparatus shown in FIG. 1, are rendered unnecessary, thereby saving labor. Moreover, the automatic operation can increase reliability during operation. Furthermore, because the opening degree of each electric individual valve 27 is controlled independently, all the 20 devices 1 are not controlled in the same manner. Thus, even when the devices generating different amounts of heat are present among the 20 devices 1, the amount of water necessary for cooling the corresponding device can be supplied by automatically adjusting the degree of opening of each valve 27. Therefore, devices generating different amounts of heat can be tested with one burn-in apparatus and the utility of the apparatus is improved. In this case when the temperature at which the burn-in test has to be conducted differs between the devices, the set temperatures tsi that differ accordingly between the devices, rather than the same set temperature ts, are provided by the temperature setter Cs to the corresponding temperature regulators 9-*i*.

An example employing water as a heat transfer medium was explained above, but as a heat transfer medium, an appropriate coolant with a low saturation temperature such as, for example, perfluorocarbon, which has an evaporation temperature of about −20° C., may be used. In such cases, the water supply system 2 and the sprayer 3 that is the water discharge means, which are shown in FIGS. 1, 5, and 8, become a liquid supply system and a sprayer 3 that is a liquid discharge means. The coolant liquid is put into the water inlet hole 31 of the sprayer 3 shown in FIG. 2 from the all-stage common system 24 and the individual system 26 of the water supply system 2.

The supplied coolant liquid absorbs heat generated by the device 1, evaporates, becomes a coolant vapor, and is discharged from the evacuation vent 47 shown in FIG. 1; it is desirable that this be collected. In this case, a commonly known refrigeration device is provided, and the collected coolant vapor is returned to its state as a coolant liquid and supplied again. If, in this way, a liquid coolant with a low evaporation temperature is used, the configuration of the apparatus becomes complicated, but because the temperature difference with the device 1 becomes large, the liquid coolant can be evaporated more reliably and completely.

The present invention can be advantageously used in burn-in tests for, in particular, those semiconductor devices that generate a large amount of heat.

The present invention may be embodied in other specific forms without departing from its spirit or essential characteristics. The described embodiments are to be considered in all respects only as illustrative and not as restrictive. The scope of the invention is, therefore, indicated by the appended claims and their combination in whole or in part rather than by the foregoing description. All changes that come within the meaning and range of equivalency of the claims are to be embraced within their scope.

We claim:

1. A burn-in apparatus for cooling a semiconductor device to a burn-in temperature;
   said semiconductor device including a first surface, said first surface being planar, said semiconductor device passing electric current therethrough and generating heat so that a temperature thereof rises above said burn-in temperature and a temperature of said first surface rises;
   said apparatus comprising:
   liquid supply means for pressurizing and supplying liquid that cools said semiconductor device, said liquid having a saturation temperature at an atmospheric pressure that is lower than said temperature of said first surface when said temperature of said first surface rises; and
   a separation member that is in a form of a curved thin sheet that is convex on a side proximal to said first surface and pressable against said first surface so that said separation member lays flat against and covers said first surface and transfers heat from said first surface, said separation member being separable from said first surface; and
   liquid discharge means for supplying, discharging at a reduced pressure and atomizing said liquid which is supplied from said liquid supply means so that said liquid reaches a surface opposite to said first surface on said separation member.

2. The burn-in apparatus of claim 1, further comprising:
   a temperature detection means for detecting a temperature of said semiconductor device;
   a flow rate adjustment means for adjusting a flow rate of said liquid; and
   a control means for controlling said flow rate adjusting means so that said semiconductor device is cooled whereby the temperature detected by the temperature detection means becomes said burn-in temperature.

3. The burn-in apparatus according to claim 1 or 2, wherein said liquid is water, said liquid supply means is a water supply means, and said liquid discharge means is a water discharge means.

* * * * *